(12) United States Patent
Kim et al.

(10) Patent No.: US 8,221,178 B2
(45) Date of Patent: Jul. 17, 2012

(54) METHOD FOR FABRICATING ORGANIC ELECTRO-LUMINESCENCE DISPLAY DEVICE

(75) Inventors: Jeong Hyun Kim, Gyeonggi-do (KR); Choong Keun Yoo, Gyeonggi-do (KR); Kang Ju Lee, Gyeonggi-do (KR)

(73) Assignee: LG Philips LCD Co., Ltd., Seoul (KR)

( * ) Notice: Subject to any disclaimer, the term of this patent is extended or adjusted under 35 U.S.C. 154(b) by 331 days.

(21) Appl. No.: 11/821,209

(22) Filed: Jun. 22, 2007

(65) Prior Publication Data

US 2008/0012476 A1 Jan. 17, 2008

(30) Foreign Application Priority Data

Jun. 30, 2006 (KR) .................. 10-2006-0060065

(51) Int. Cl.
*H01J 9/26* (2006.01)
*H01J 9/32* (2006.01)
(52) U.S. Cl. .......................................... 445/25; 445/24
(58) Field of Classification Search .................. 313/493, 313/500, 504, 506, 512; 257/99; 428/917; 438/99, 118, 127; 362/84, 267; 445/24, 445/25, 43, 44
See application file for complete search history.

(56) References Cited

U.S. PATENT DOCUMENTS

| | | | | |
|---|---|---|---|---|
| 6,081,071 A * | 6/2000 | Rogers | .......................... | 313/512 |
| 6,111,357 A * | 8/2000 | Fleming et al. | ............... | 313/509 |
| 6,195,142 B1 * | 2/2001 | Gyotoku et al. | ................ | 349/69 |
| 6,416,375 B1 * | 7/2002 | Cho et al. | ......................... | 445/25 |
| 6,605,893 B2 * | 8/2003 | Ando | ............................. | 313/495 |
| 6,861,801 B2 * | 3/2005 | Kim et al. | ...................... | 313/512 |
| 7,306,346 B2 * | 12/2007 | Fukuoka et al. | ................ | 362/84 |
| 7,321,134 B2 * | 1/2008 | Yoo | .................................. | 257/40 |
| 7,474,061 B2 * | 1/2009 | Oh et al. | ..................... | 315/169.3 |
| 7,586,255 B2 * | 9/2009 | Kim | ................................. | 313/504 |
| 7,710,021 B2 * | 5/2010 | Yoo et al. | ....................... | 313/504 |
| 7,777,219 B2 * | 8/2010 | Lee | .................................. | 257/40 |
| 2002/0044111 A1 * | 4/2002 | Yamazaki et al. | .............. | 345/83 |
| 2002/0146533 A1 * | 10/2002 | Chung et al. | .................... | 428/76 |
| 2003/0090615 A1 * | 5/2003 | Park | .............................. | 349/153 |
| 2003/0122476 A1 * | 7/2003 | Wang et al. | ..................... | 313/493 |
| 2003/0127976 A1 * | 7/2003 | Kim et al. | ....................... | 313/504 |
| 2004/0075380 A1 * | 4/2004 | Takemoto et al. | ............ | 313/500 |
| 2005/0036090 A1 * | 2/2005 | Hayashi et al. | ............... | 349/122 |
| 2005/0127825 A1 * | 6/2005 | Bae et al. | ........................ | 313/504 |
| 2005/0140290 A1 * | 6/2005 | Park et al. | ....................... | 313/512 |
| 2006/0105493 A1 * | 5/2006 | Hunze et al. | .................... | 438/99 |
| 2006/0121363 A1 * | 6/2006 | Kwon | ............................... | 430/5 |
| 2006/0197446 A1 * | 9/2006 | Tomimatsu et al. | ........... | 313/512 |
| 2007/0132364 A1 * | 6/2007 | Ahn et al. | ....................... | 313/498 |
| 2007/0145887 A1 * | 6/2007 | Chae et al. | ..................... | 313/504 |
| 2007/0173167 A1 * | 7/2007 | Choi | ................................ | 445/25 |
| 2008/0018245 A1 * | 1/2008 | Kim et al. | ...................... | 313/512 |

* cited by examiner

*Primary Examiner* — Mariceli Santiago
*Assistant Examiner* — Glenn D Zimmerman
(74) *Attorney, Agent, or Firm* — Brinks Hofer Gilson & Lione

(57) ABSTRACT

An organic electro-luminescence display device includes a thin film transistor on a first substrate, where the thin film transistor has a drain region and a common electrode connected to the drain region. An organic electro-luminescence diode resides on a second substrate, where the organic electro-luminescence diode includes a spacer covered with a diode electrode. First and second sealant materials reside at a periphery of the first and second substrates, where the first sealant material surrounds the thin film transistor and the organic electro-luminescence diode, and the second sealant material surrounds an outer perimeter of the first sealant material. The first and second substrates are bonded together, such that the common electrode of the thin film transistor contacts the diode electrode of the organic electro-luminescence diode. The bonding process is carried out by sequentially sealing the first sealant material and the second sealant material.

11 Claims, 4 Drawing Sheets

METHOD FOR FABRICATING ORGANIC ELECTRO-LUMINESCENCE DISPLAY DEVICE

RELATED APPLICATION

The present application claims the benefit of priority under 35 U.S.C. §119 to Korean Patent Application No. 2006-060065 filed in Korea on Jun. 30, 2006, which is hereby incorporated by reference.

BACKGROUND

1. Technical Field

The present invention relates to an organic electro-luminescence display device, and more particularly, to an organic electro-luminescence display device, in which a first substrate and a second substrate are attached using a frit glass, and a method for fabricating the same.

2. Description of the Related Art

An organic electro-luminescence display device displays an image using light generated when pairs of electrons and holes are created in semiconductors, or carriers excited to a high-energy state return to a stable state, i.e., a ground state. Since the organic electro-luminescence display device is a self-luminous display device, no backlight is required, unlike a liquid crystal display device (LCD). Therefore, the organic electro-luminescence display device is lightweight and slim and has low power consumption, high contrast ratio, and wide viewing angle. In addition, the organic electro-luminescence display device can be driven at a low DC voltage and has a rapid response time. Since all components of the organic electro-luminescence display device are formed of solid materials, it is robust against external impact. Moreover, the organic electro-luminescence display device can be used in a wide temperature range and can be manufactured at low cost.

In such an organic electro-luminescence display device, an encapsulation process is performed to attach a substrate, on which array elements and organic electro-luminescent diodes are formed, to a separate encapsulation substrate. Thus, the organic electro-luminescent diodes can be protected against external moisture and oxygen. Dark spots may occur in the organic electro-luminescence display device because it is susceptible to moisture and oxygen. The occurrence of the dark spots will reduce the lifetime of the organic electro-luminescence display device and degrade its reliability in high-temperature high-humidity environment.

SUMMARY

In one embodiment, a method for fabricating an organic electro-luminescence display device includes providing a first substrate having a thin film transistor thereon. A second substrate is provide having an organic electro-luminescence diode thereon. A first sealant material is positioned around the thin film transistor and the organic electro-luminescence diode, and a second sealant material is positioned around an outer perimeter of the first sealant material. The first and second substrates are aligned such that the thin film transistor and the organic electro-luminescence diode are in close proximity and the first and second substrates are bonded together by sequentially sealing the first sealant material and the second sealant material.

In accordance with another embodiment, a method for fabricating an organic electro-luminescence display device includes forming a thin film transistor on a first substrate, where the thin film transistor has a drain region and a common electrode connected to the drain region. An organic electro-luminescence diode is formed on a second substrate, where the organic electro-luminescence diode includes a spacer covered with a diode electrode. A first sealant material is formed around the thin film transistor and the organic electro-luminescence diode, and a second sealant material is formed around an outer perimeter of the first sealant material. The first and second substrates are aligned, such that the common electrode of the thin film transistor and the diode electrode of the organic electro-luminescence diode form an electrical contact. The first and second substrates are bonded together by sequentially sealing the first sealant material and the second sealant material.

In yet another embodiment, an organic electro-luminescence display device includes a thin film transistor on a first substrate, where the thin film transistor has a drain region and a common electrode connected to the drain region. An organic electro-luminescence diode resides on a second substrate, where the organic electro-luminescence diode includes a spacer covered with a diode electrode. First and second sealant materials reside at a periphery of the first and second substrates, where the first sealant material surrounds the thin film transistor and the organic electro-luminescence diode, and the second sealant material surrounds an outer perimeter of the first sealant material. The first and second substrates are arranged, such that the common electrode of the thin film transistor contacts the diode electrode of the organic electro-luminescence diode.

It is to be understood that both the foregoing general description and the following detailed description of the present invention are exemplary and explanatory and are intended to provide further explanation of the invention as claimed.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
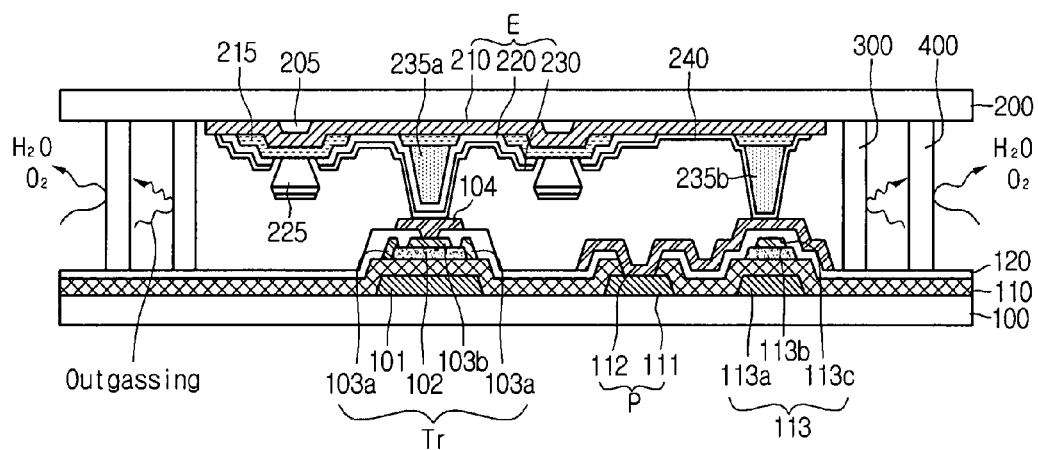
FIG. 1 is a cross-sectional view of an organic electro-luminescence display device according to an embodiment of the present invention.

FIG. 1 is a cross-sectional view of an organic electro-luminescence display device according to an embodiment of the present invention.

Referring to FIG. 1, the organic electro-luminescence display device includes first and second substrates 100 and 200 and an organic electro-luminescent diode E. The first and second substrates 100 and 200 are spaced apart from each other by a predetermined distance, and the organic electro-luminescent diode E is formed between the first substrate 100 and the second substrate 200. First and second sealants 300 and 400 are formed in the periphery of the first substrate 100 or the second substrate 200 and seal the organic electro-luminescent diode E. In addition, the first and second sealants 300 and 400 attach the first substrate 100 to the second substrate 200.

The first sealant 300 is formed of ultraviolet (UV) curable resin, and the second sealant 400 is formed of frit glass having good moisture tolerance and adhesive property. Therefore, the organic electro-luminescent diode can be protected against external moisture and oxygen, thereby increasing the lifetime and reliability of the organic electro-luminescence display device.

The second sealant 400 is formed outside the first sealant 300. Specifically, the second sealant 400 seals the first sealant 300 and the organic electro-luminescent diode E and attaches the first substrate 100 to the second substrate 200. The second sealant 400 includes an organic binder as well as the frit glass. Outgassing generated during the curing process of the second sealant 400 damages an organic emission layer of the organic electro-luminescent diode. This may reduce the lifetime of the organic electro-luminescent diode and generate dark spots.

The first sealant 300 serves as a barrier layer that prevents the outgas generated during the curing process of the second sealant 400 from flowing into the organic electro-luminescent diode.

A thin film transistor (TFT) Tr is formed on the first substrate 100, and the organic electro-luminescent diode E is formed on the second substrate 200.

Specifically, a plurality of gate lines cross a plurality of data lines over the first substrate 100. The TFT Tr is formed in a subpixel defined by the crossing of the gate lines and the data lines. The TFT Tr includes a gate electrode 101, a semiconductor layer 102, and source/drain electrodes 103a and 103b. A gate insulating layer 110 overlies first substrate 100 and separates gate electrode 101 from semiconductor layer 102. Characteristics of the TFT Tr can be improved by increasing a channel length of the TFT, such as an area corresponding to the source electrode 103a and the drain electrode 103b. That is, the source electrode 103a is formed to surround the periphery of the drain electrode 103b.

A passivation layer 120 is formed over the first substrate 100 where the TFT Tr is formed. A connection electrode 104 is formed on the passivation layer 120 to contact the drain electrode 103b of the TFT Tr. The TFT Tr is electrically connected to the organic electro-luminescent diode E through the connection electrode 104. That is, the TFT Tr is electrically connected to a second electrode 230 of the organic electro-luminescent diode E.

A common voltage pad P is formed on the first substrate 100 to receive a common voltage from an external circuit and provide the received common voltage to the organic electro-luminescent diode E. The common voltage pad P includes a power electrode 111 and a power contact electrode 112. The power electrode 111 is electrically connected to a common voltage line formed in the first substrate 100, and the power contact electrode 112 is electrically connected to a first electrode 210 of the organic electro-luminescent diode formed on the second substrate 200.

A dummy pattern 113 is formed between the power electrode 111 and the power contact electrode 112. The dummy pattern 113 has the same height difference as that of the TFT Tr.

The organic electro-luminescent diode E including the first electrode 210, an organic emission layer 220, and the second electrode 230 is formed under the second substrate 200.

The first electrode 210 is formed on the second substrate 200 using a transparent conductive material, for example, indium tin oxide (ITO), indium zinc oxide (IZO), and the like.

An auxiliary electrode 205 may be further formed between the second substrate 200 and the first electrode 210. The auxiliary electrode 205 reduces the resistance of the first electrode 210. At this point, the auxiliary electrode 205 is formed of a low-resistance metal and is mostly opaque. Therefore, the auxiliary electrode 205 is preferably formed at a region corresponding to a non-emission region.

The organic emission layer 220 may further include at least one of a hole injection layer (HIL), a hole transport layer (HTL), a hole blocking layer (HBL), an electron transport layer (ETL), and an electron injection layer (EIL) under or above the organic emission layer 220. Therefore, electrons and holes can be more readily injected into the organic emission layer 220 because energy levels can be appropriately adjusted at boundaries of the first electrode 210, the organic emission layer 220, and the second electrode 230. Hence, the luminous efficiency of the organic electro-luminescence display device can be significantly improved.

A separator 225 is disposed on a buffer layer 215 formed in the periphery of a subpixel. The second electrode 230 is automatically patterned in each subpixel by the separator 225. In addition, the second electrode 230 is formed to surround the periphery of a first spacer 235a that constantly maintains a cell gap between the first substrate 100 and the second substrate 200. Due to the first spacer 235a, a portion of the second electrode 230 protrudes toward the first substrate 200. The protrusion of the second electrode 230 contacts the connection electrode 104.

The organic electro-luminescence display device further includes a second spacer 235b having the same height as the first spacer 235a. The second spacer 235b electrically connects the common voltage pad P to the first electrode 210. Specifically, the second spacer 235b is formed in a region corresponding to the region where the power contact electrode 112 is formed. At this point, a second electrode dummy pattern 240 separated from the second electrode 230 is formed to surround the second spacer 235b. The second electrode dummy pattern 240 surrounding the second spacer 235b contacts the power contact electrode 112. The second electrode dummy pattern 240 separated from the second electrode 230 is electrically connected to the first electrode 210. The first electrode 210 and the power contact electrode 112 are electrically connected by the second spacer 235b, so that the common voltage can be applied to the first electrode 210. In addition, the second spacer 235b is formed to correspond to the dummy pattern 113 having the same height difference as the TFT Tr.

Because the first substrate 100 and the second substrate 200 are attached to each other by the double seal patterns, the organic electro-luminescent diode can be completely protected against outgas generated during the curing process of the second sealant 400, as well as external moisture and oxygen. Therefore, the lifetime and reliability of the organic electro-luminescence display device can be significantly improved.

Although the dual-panel type organic electro-luminescence display device has been described above, the present invention is not limited thereto. For example, the organic electro-luminescent diode E electrically connected to the TFT Tr may be formed on the first substrate 100.

FIGS. 2A to 2E are cross-sectional views illustrating a method for fabricating an organic electro-luminescence display device according to an embodiment of the present invention.

Figure 2A:
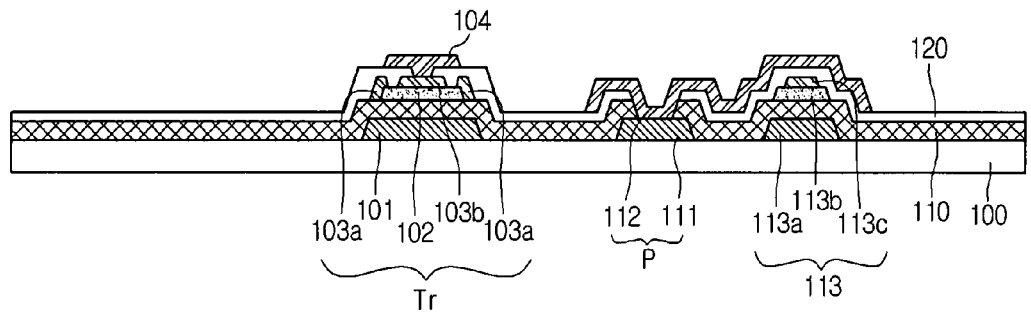
FIGS. 2A to 2E are cross-sectional views illustrating a method for fabricating an organic electro-luminescence display device according to an embodiment of the present invention.

Referring to FIG. 2A, a first substrate 100 is prepared, and a TFT Tr is formed on the first substrate 100.

Specifically, a conductive layer is formed on the first substrate 100 and is patterned to form a gate line (not shown) and a gate electrode 101. At this point, the gate line is formed in one direction and the gate electrode 101 is branched from the gate line. Simultaneously, a power electrode 111 may be formed such that it receives a common voltage from an external signal and applies the received common voltage to an organic electro-luminescent diode, which will be described later. In addition, a first dummy pattern 113a is formed spaced apart from the power electrode 111 by a predetermined distance.

A gate insulating layer 110 is formed over the first substrate 100 where the gate electrode 101 is formed. The gate insulating layer 110 may be formed of a silicon oxide layer, a silicon nitride layer, or a stacked layer thereof, which is deposited using a chemical vapor deposition (CVD) process.

A semiconductor layer 102 is formed on a portion of the gate insulating layer 110 that corresponds to the gate electrode 101. Simultaneously, a second dummy pattern 113b corresponding to the first dummy pattern 113a may be further formed on the gate insulating layer 110.

A first conductive layer (not shown) is formed oh the semiconductor layer 102 and the gate insulating layer 110 and is patterned to form a data line (not shown) crossing the gate line (not shown). Simultaneously, a drain electrode 103b is formed on a center portion of the semiconductor layer 102, and a source electrode 103a is formed in an annular shape to surround the periphery of the drain electrode 103b. Therefore, characteristics of a TFT Tr can be improved by increasing a channel region of the TFT Tr, such as an area corresponding to the source electrode 103a and the drain electrode 103b. A third dummy pattern 113C may be further formed on the second dummy pattern 113b.

In this way, the TFT Tr including the gate electrode 101, the semiconductor layer 102 and the source/drain electrodes 103a and 103b, and the dummy pattern 113 having the same height difference as the TFT Tr are formed.

A passivation layer 120 is formed over the TFT Tr and the gate insulating layer 110. The passivation layer 120 may be formed of an organic layer or an inorganic layer. For example, the organic layer may be benzo-cylco-butene (BCB), polyimide (PI), or Novolac resin, and the inorganic layer may be a silicon oxide layer, a silicon nitride layer, or a stacked layer thereof.

Contact holes are formed in the passivation layer 120 to expose a portion of the drain electrode 103b of the TFT Tr and a portion of the power electrode 111, respectively.

A conductive layer is formed on the passivation layer 120 where the contact holes are formed, and is patterned to form a connection electrode 104 electrically connected to the drain electrode 103b. Simultaneously, a power contact electrode 112 may be formed. The power contact electrode 112 is disposed on the first to third dummy patterns 113a, 113b and 113c, so that it has a height difference like the connection electrode 104.

Figure 2B:
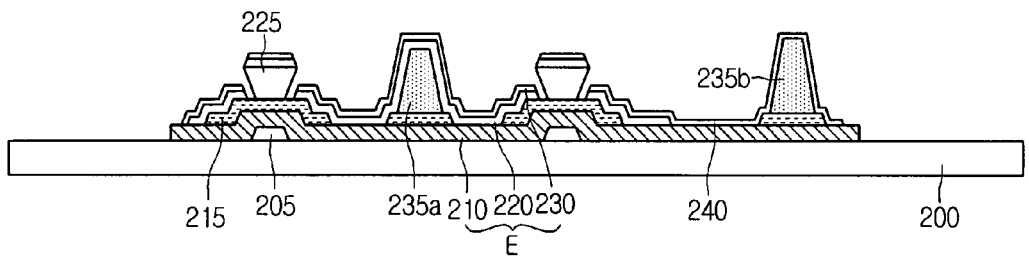

Referring to FIG. 2B, a second substrate 200 where an organic electro-luminescent diode E is formed is prepared.

Specifically, the second substrate 200 is prepared, and a first electrode 210 is formed as a common electrode on the second substrate 500. The first electrode 210 is formed of a transparent conductive material having a high work function. For example, the first electrode 210 may be formed of ITO or IZO.

A buffer layer 215 is formed to define pixel regions on the first electrode 210. The buffer layer is formed of an insulating layer. A separator 225 is formed on the buffer layer 215. The separator 225 may be formed in a shape of a reversely tapered partition wall. The separator 225 may be formed of an organic insulating material. In addition, an island-shaped buffer layer 215 is further formed in a subpixel, and a first spacer 235a is formed on the buffer layer 215. Simultaneously, a second separator is formed to have the same height as that of the first spacer 235a.

An organic emission layer 220 and a second electrode 230 are sequentially formed over the first spacer 235a and the first electrode 210. The second electrode 230 is automatically separated in each subpixel by the separator 225. In addition, because the second electrode 230 extends while surrounding the periphery of the first spacer 235a, a portion of the second electrode 230 is protruded upwards by the first spacer 235a.

At the same time, a second electrode dummy pattern 240 is formed in the periphery of the second substrate 200 and contacts the first electrode 210. Because the second electrode dummy pattern 240 is formed to surround the periphery of the second spacer 235b, a portion of the second electrode dummy pattern 240 is protruded upwards. At this point, the second electrode dummy pattern 240 is separated from the second electrode 200.

Before forming the organic emission layer 220, a hole injection layer and/or a hole transport layer may be further formed. In addition, after forming the organic emission layer 220, at least one of a hole blocking layer, an electrode transport layer and an electrode injection layer may be further formed.

Figure 2C:
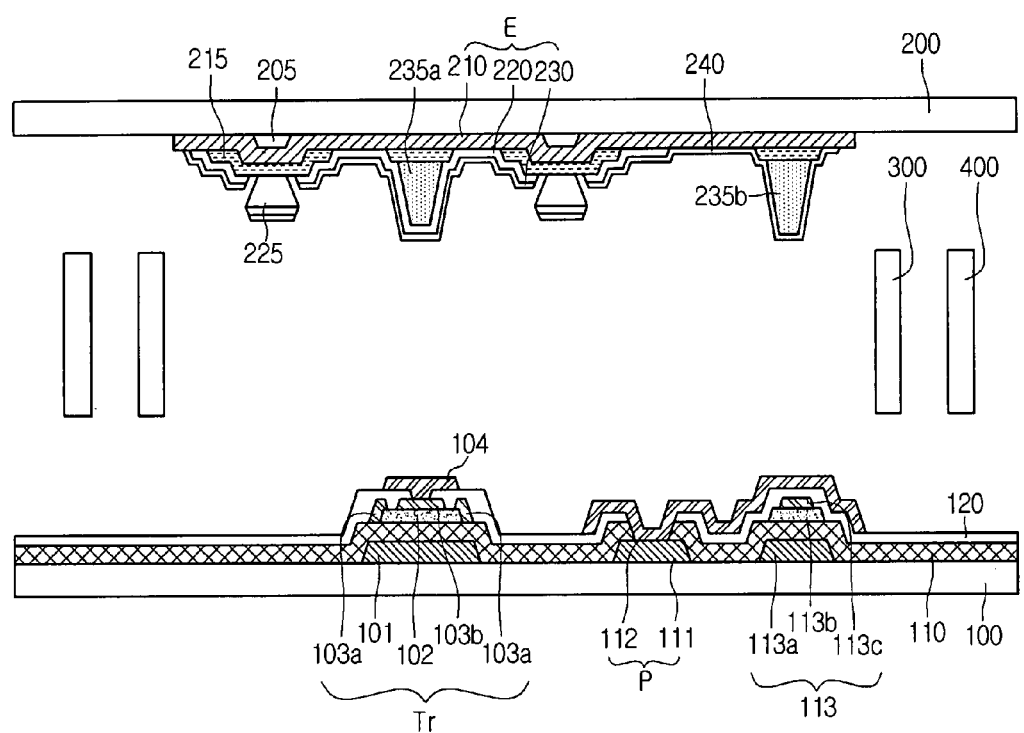

Referring to FIG. 2C, a first sealant 300 and a second sealant 400 are formed in a periphery of the first substrate 100 where the TFT Tr is formed or a periphery of the second substrate 200 where the organic electro-luminescent diode E is formed. At this point, the second sealant 400 is formed outside the first sealant 300. The first sealant 300 is formed of UV curable resin, and the second sealant 400 is formed of frit glass.

Figure 2D:
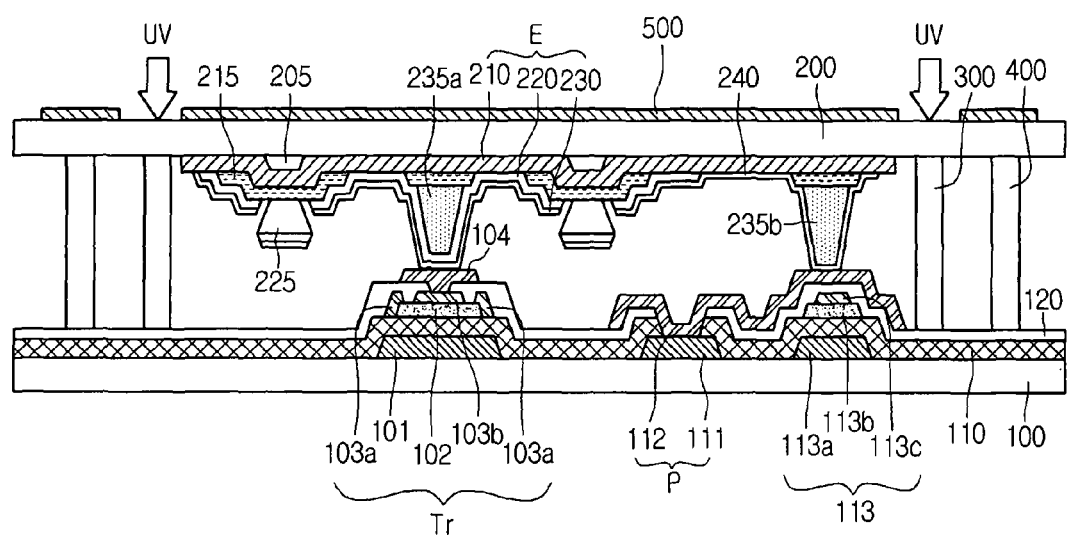

Referring to FIG. 2D, the first substrate 100 and the second substrate 200 are aligned, such that the TFT Tr and the common voltage pad P are in electrically contact with the organic electro-luminescent diode E. That is, the connection electrode 104 contacts the second electrode 230 overlying the first spacer 235a. In addition, the power contact electrode 112 corresponding to the dummy pattern 113 is electrically contacted with the second electrode dummy pattern 240 overlying the second spacer 235b.

The first sealant 300 is cured by irradiating UV light thereon. At this point, a first mask 500 is placed on the rear of the second substrate 200 such that the UV light can be irradiated only onto the first sealant 300.

Figure 2E:
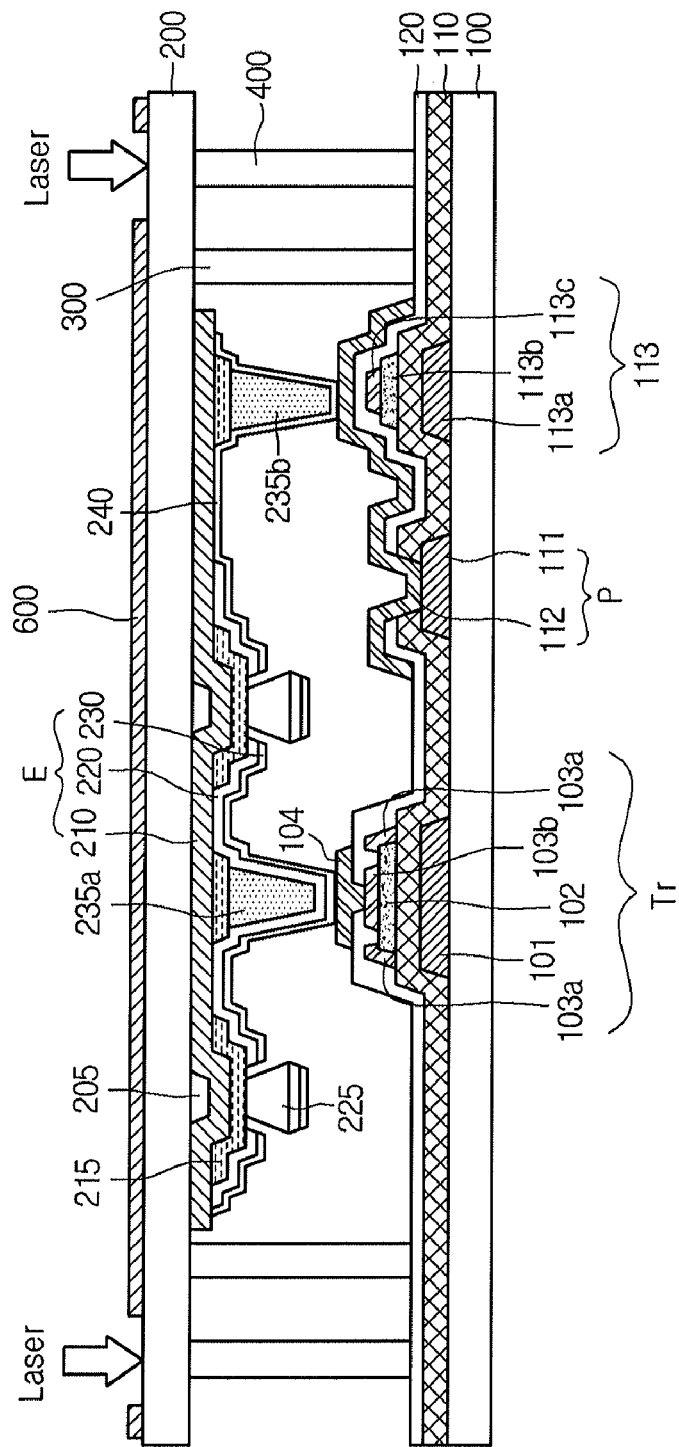

Referring to FIG. 2E, the second sealant 400 is cured by irradiating a laser beam generated from a laser device onto the second sealant 400. Although outgas may be generated from the second sealant 400, the first sealant 300 can prevent the generated outgas from moving toward the organic electro-luminescent diode. In addition, a second mask 600 is placed on the rear of the second substrate 200 such that the laser beam can be irradiated only onto the second sealant 400.

In addition, the second sealant 400 can be cured using a beam heater. The beam heater may have a wavelength ranging from about 0.1 μm to about 200 μm. Because the beam heater can irradiate light onto the second sealant 400 in a line type or a rectangular type, the curing time of the second sealant 400 can be reduced. Consequently, time during which the organic electro-luminescent diode E is exposed to high-temperature heat is reduced, the degradation of the organic electro-luminescent diode E can be reduced and the deformation of the first substrate 100 or the second substrate 200 can be prevented.

In using the laser device or the beam heater to cure the second sealant 400, the second sealant 400 is cured by supplying energy only to the region where the second sealant 400 is formed. Therefore, the influence on the organic electro-luminescent diode E can be reduced.

In this way, the organic electro-luminescent diode E can be prevented from being degraded and protected against oxygen or moisture, thereby increasing the lifetime and reliability of the organic electro-luminescence display device.

In addition, the reduction of a defect ratio and the increase of a production yield can be expected by forming the TFT Tr and the organic electro-luminescent diode E on the different substrates and attaching the two substrates to each other. Accordingly, the organic electro-luminescence display device having the extended lifetime and improved reliability can be provided through an encapsulation process using the frit glass having good tolerance against oxygen and moisture.

Furthermore, the organic electro-luminescent diode can be prevented from being damaged due to outgassing generated during the encapsulation process using the frit glass.

Moreover, the influence on the organic electro-luminescent diode, such as the degradation of the organic electro-luminescent diode, can be prevented by irradiating energy only to the region where the sealant is formed. It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating an organic electro-luminescence display device comprising:
   providing a first substrate having a thin film transistor, a dummy pattern, a power contact electrode and a passivation layer thereon;
   providing a second substrate having an organic electro-luminescence diode and dummy electrode thereon, the organic electro-luminescence diode including a first spacer and a second spacer covered with a diode electrode;
   positioning a first sealant material around the thin film transistor and the organic electro-luminescence diode and positioning a second sealant material around an outer perimeter of the first sealant material and spaced apart from the first sealant material;
   aligning the first and second substrates such that the thin film transistor and the organic electro-luminescence diode are in close proximity; and
   bonding the first and second substrates together by sequentially sealing the first sealant material and the second sealant material,
   wherein the second sealant material is formed of a glass frit,
   wherein sequentially sealing the first sealant material and the second sealant material comprises sealing the first sealant material, such that the first sealant material substantially prevents contamination from outgassing during sealing of the second sealant material from contacting the organic electro-luminescence diode,
   wherein the sequentially sealing the second sealant material comprises irradiating the second sealant material with a beam heater,
   wherein the beam heater irradiates light onto the second sealant material in a rectangular type,
   wherein the first and second sealant materials are formed on the passivation layer and contact with the passivation layer, wherein the passivation layer is formed of an inorganic layer.

2. The method of claim 1, wherein the sequentially sealing the first sealant material comprises curing the first sealant material by exposure to a UV light.

3. The method of claim 1, wherein the curing the first sealant material comprises forming a mask pattern on a side of the second substrate opposite the organic electro-luminescence diode and irradiating the first sealant material through the second substrate.

4. The method of claim 1, wherein the irradiating the second sealant material with a beam heater comprises irradiating with at least one wavelength from a range about 0.1 μm to about 200 μm.

5. The method of claim 1, wherein the positioning a first sealant material around the thin film transistor and the organic electro-luminescence diode comprises forming a UV curable resin on the periphery of the first substrate or the second substrate.

6. The method of claim 1, wherein the positioning a second sealant material around an outer perimeter of the first sealant material comprises forming the glass frit including an organic binder on the periphery of the first substrate or the second substrate.

7. The method of claim 1, wherein each of the first sealant and the second sealant material is formed from a material selected from the group consisting of an ultraviolet curable resin and a heat curable resin.

8. A method for fabricating an organic electro-luminescence display device comprising:
   forming a passivation layer, a thin film transistor, a dummy pattern and a power contact electrode on a first substrate, the thin film transistor having a drain electrode and a connection electrode connected to the drain electrode;
   forming an organic electro-luminescence diode and dummy electrode on a second substrate, the organic electro-luminescence diode including a first spacer and a second spacer covered with a diode electrode;
   forming a first sealant material around the thin film transistor and the organic electro-luminescence diode and forming a second sealant material around an outer perimeter of the first sealant material and spaced apart from the first sealant material;
   aligning the first and second substrates, such that the connection electrode of the thin film transistor and the diode electrode of the organic electro-luminescence diode form an electrical contact; and
   bonding the first and second substrates together by sequentially sealing the first sealant material and the second sealant material,
   wherein the second sealant material is formed of a glass frit,
   wherein sequentially sealing the first sealant material and the second sealant material comprises sealing the first sealant material, such that the first sealant material substantially prevents contamination from outgassing during sealing of the second sealant material from contacting the organic electro-luminescence diode,
   wherein the sequentially sealing the second sealant material comprises irradiating the second sealant material with a beam heater, wherein the beam heater irradiates light onto the second sealant material in a rectangular type, wherein the first and second sealant materials are formed on the passivation layer and contact with the passivation layer, wherein the passivation layer is formed of an inorganic layer.

9. The method of claim 8, further comprising forming a gate insulating layer on the first substrate and a passivation layer overlying the gate insulating layer, wherein the first sealant material and the second sealant material contact the passivation layer.

10. The method of claim 8, wherein the sequentially sealing the first sealant material comprises forming a mask pattern on a side of the second substrate opposite the organic electro-luminescence diode and irradiating the first sealant material though the second substrate with UV light.

11. The method of claim 8, wherein the sequentially sealing the second sealant material comprises forming a mask pattern on a side of the second substrate opposite the organic electro-luminescence diode.

* * * * *